United States Patent [19]

Yamamoto

[11] Patent Number: 4,650,031

[45] Date of Patent: Mar. 17, 1987

[54] CABINET FOR LOUDSPEAKER

[75] Inventor: Shuji Yamamoto, Tokyo, Japan

[73] Assignee: Bose Corporation, Framingham, Mass.

[21] Appl. No.: 830,202

[22] Filed: Feb. 18, 1986

[30] Foreign Application Priority Data

Jun. 15, 1985 [JP] Japan ................................ 60-130244

[51] Int. Cl.⁴ ................................................ H05K 5/00

[52] U.S. Cl. .................................... 181/156; 181/152; 181/199

[58] Field of Search ............... 181/152, 155, 156, 159, 181/199

[56] References Cited

U.S. PATENT DOCUMENTS

| | | | |
|---|---|---|---|
| 2,866,513 | 12/1958 | White | 181/156 |
| 4,284,166 | 8/1981 | Gale | 181/156 |
| 4,572,326 | 2/1986 | Hutchins | 181/156 X |

*Primary Examiner*—Benjamin R. Fuller
*Attorney, Agent, or Firm*—Charles Hieken

[57] ABSTRACT

A cabinet for a loudspeaker is disclosed, which has a duct communicating the inside and outside of the cabinet. The duct includes a first duct section open to the inside of the cabinet and having a substantially constant sectional area and a second duct section extending from the first duct section toward the outside of the cabinet, the sectional area of the second duct section being gradually increased from the first duct section toward the outside of the cabinet.

4 Claims, 13 Drawing Figures

CABINET FOR LOUDSPEAKER

BACKGROUND OF THE INVENTION

1. Field of the Invention

This invention relates to a cabinet for a loudspeaker used for an audio apparatus such as a stereo apparatus and, more particularly, to a cabinet having a duct communicating the inside and outside of the cabinet.

2. Description of the Prior Art

As a cabinet for horn-type loudspeaker, there is one, which comprises a box with a front opening and a baffle plate closing the front opening of the box, the inside and outside of the cabinet being communicated by a duct. In this cabinet, air is moved from the inside to the outside of the cabinet or in the opposite direction through the duct, whereby the sound pressure proceeding from the inside to the outside of the cabinet is effectively provided.

With the prior art cabinet, however, a vortex flow is produced at an outlet of the duct, through which air inside the cabinet is let out to the outside, so that sound including a distortion due to the vortex flow is produced.

SUMMARY OF THE INVENTION

It is an object of the present invention to provide a cabinet for a loudspeaker, that does not cause sound including a distortion due to air passing through the duct.

According to the present invention, there is provided a cabinet for mounting a loudspeaker, which comprises duct means communicating with the inside and outside of the cabinet, the duct including a first duct section open to the inside of the cabinet and having a substantially constant cross-sectional area and a second duct section extending from the first duct section toward the outside of the cabinet, the cross-sectional area of the second duct section being gradually increased from the first duct section toward the outside of the cabinet.

According to the present invention, the cross-sectional area of the second duct section that forms an outlet portion of the duct, through which air is let out to the outside of the cabinet, is gradually increased toward the outlet. Therefore, as air inside the cabinet is let out to the outside through the duct, its pressure is gradually reduced through the second duct section. That is, air pressure is gradually reduced, so that no audibly distorting vortex flow is produced. It is thus possible to cause no sound including a distortion due to air noted above.

BRIEF DESCRIPTION OF THE DRAWINGS

The other objects and features of the invention will become apparent from the following description of a preferred embodiment of the invention with reference to the accompanying drawings, in which.

DESCRIPTION OF THE PREFERRED EMBODIMENT

Figure 1:
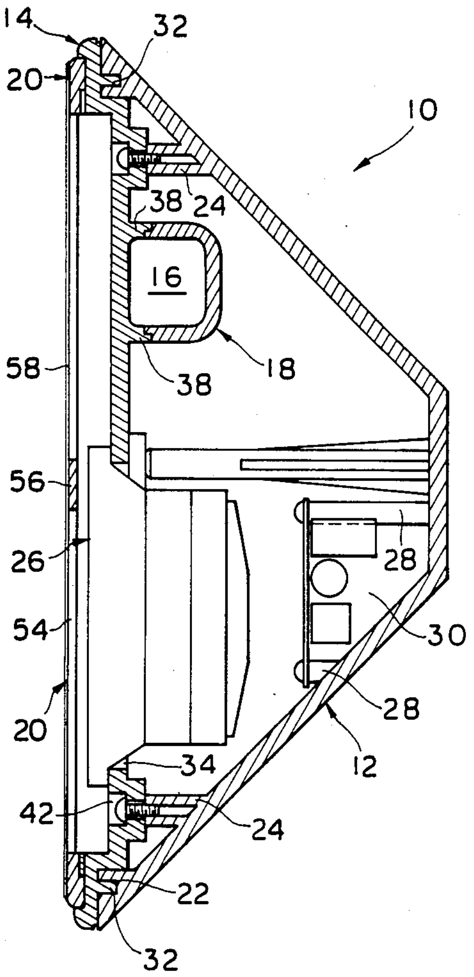
FIG. 1 is a sectional view showing an embodiment of the cabinet according to the present invention.

Referring to FIG. 1, there is shown a cabinet 10, which comprises a box 12 with an open front, a baffle plate 14 closing the open front of the box, a duct lid 18 mounted on the back side of the baffle plate 14 and defining a duct 16 together with the baffle plate 14, and a front grille 20 provided on the front side of the baffle plate 14.

Figure 3:
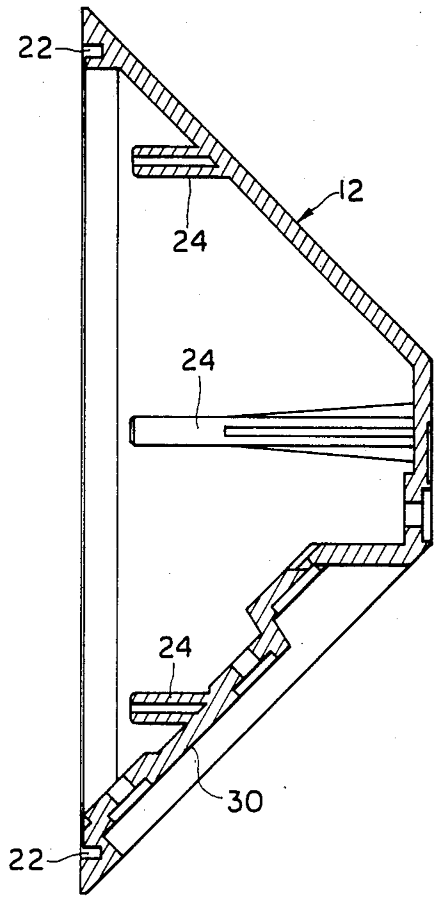
FIG. 3 is a sectional view taken along line III—III in FIG. 2.
Figure 2:
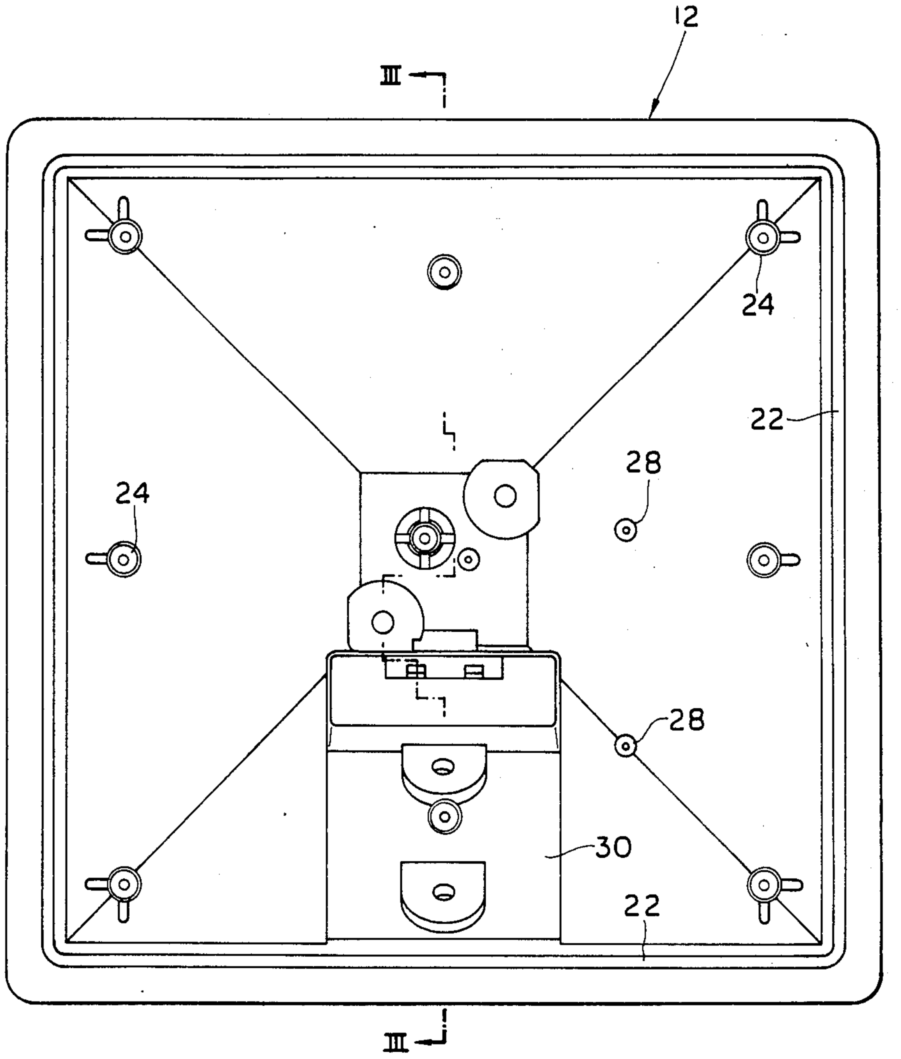
FIG. 2 is a front view showing a box.
Figure 4:
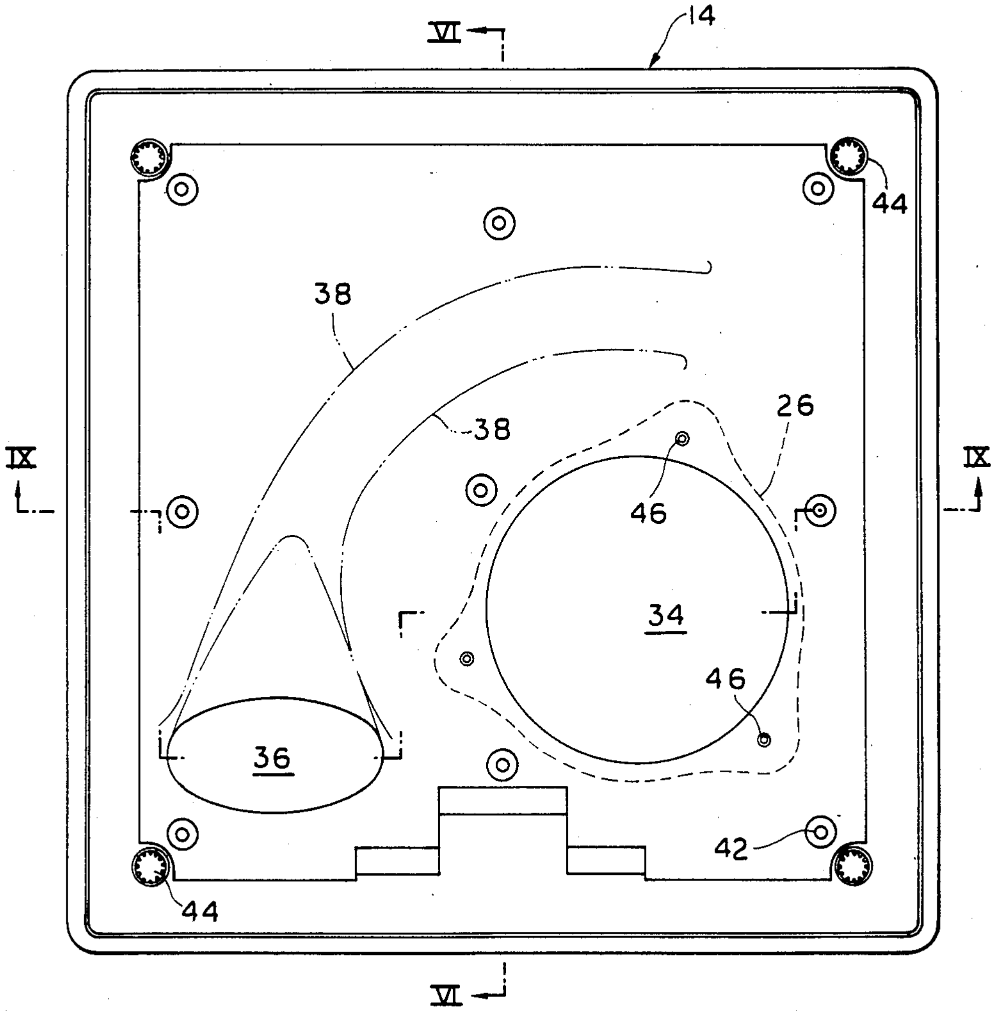
FIG. 4 is a front view showing a baffle plate.
Figure 5:
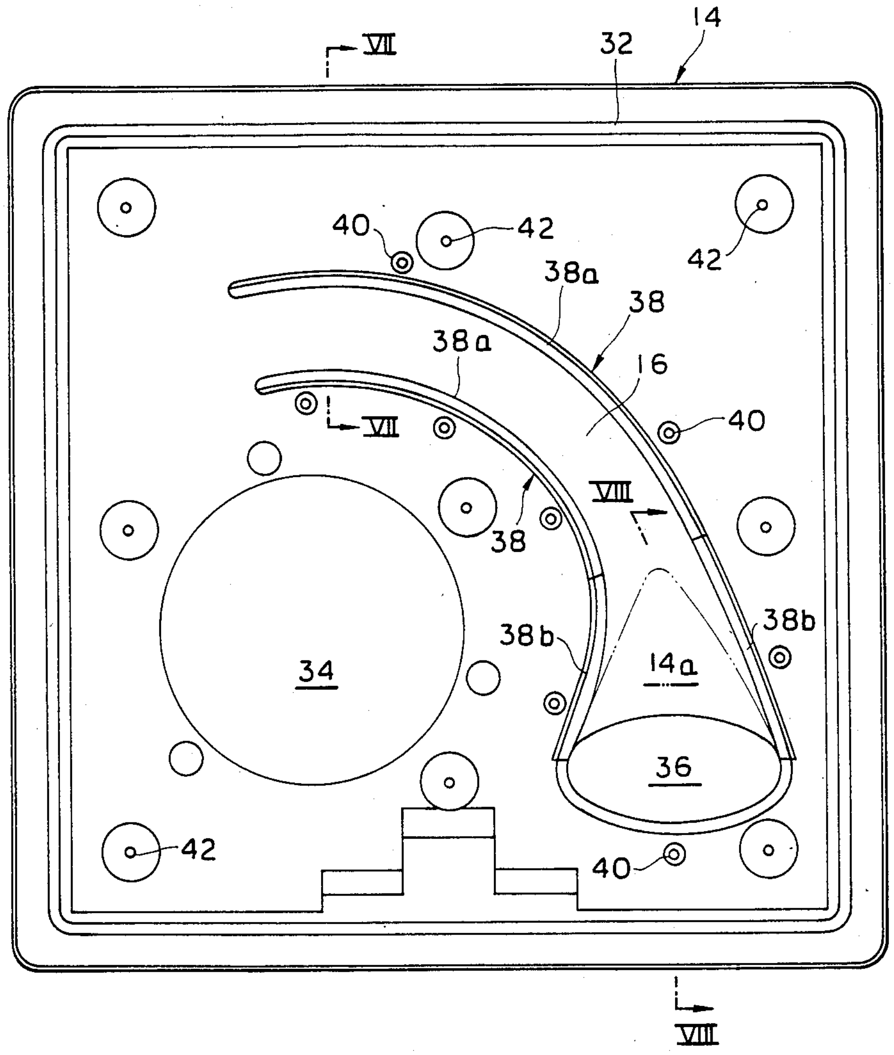
FIG. 5 is a back view showing the baffle plate.
Figure 6:
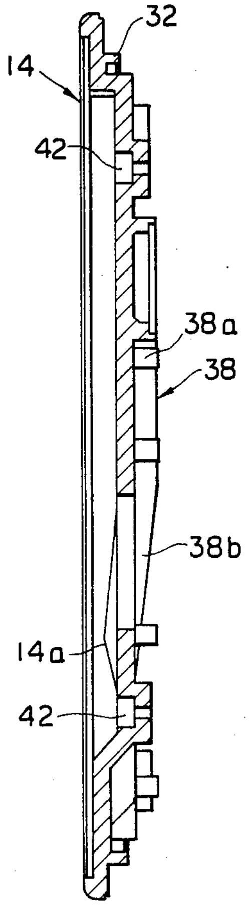
FIG. 6 is a sectional view taken along line VI—VI in FIG. 4.
Figure 7:
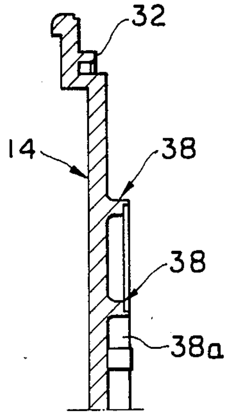
FIG. 7 is a sectional view taken along line VII—VII in FIG. 5.

As shown in FIGS. 1 to 3, the box 12 has a substantially quadrangular pyramidal shape with the front edge formed with a continuous groove 22. The box 12 has a plurality of supports 24, to which the baffle plate 14 is secured by screws, a plurality of supports 28, to which a base member electrically connected to a loudspeaker 26 is secured, and a switch support 30 for mounting switches for the loudspeaker 26. The supports 24 have female thread portions.

As shown in FIGS. 4 to 9, the baffle plate 14 has a ridge 32, which is formed on the back side along the edge thereof and is received in the groove 22 of the box 12, a circular hole 34 for receiving the loudspeaker 26, an oval hole 36 as an outlet of the duct 16, and two bulges 38 for receiving the duct lid 18.

The bulges 38 consist of first sections 38*a* extending substantially parallel to each other and second sections 38*b* extending from the first sections toward the ends of the hole 36 in the longitudinal direction thereof. The bulges 38 extend along the hole 34 toward the longitudinal ends noted above of the hole 36. The distance between the second sections 38*b* is gradually increased from the first sections toward the longitudinal ends of the hole 36.

Figure 8:
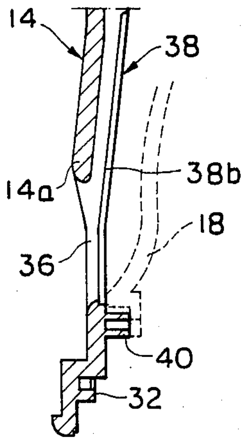
FIG. 8 is a sectional view taken along line VII—VII in FIG. 5.
Figure 9:
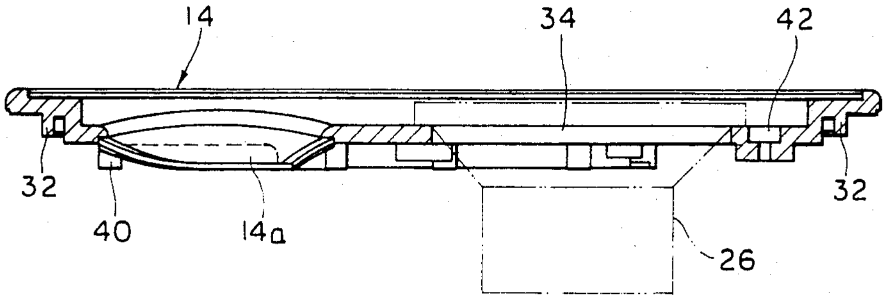
FIG. 9 is a sectional view taken along line IX—IX in FIG. 4.

As shown in FIGS. 8 and 9, a portion 14*a* of the baffle plate 14 between the second sections 38*b* of the bulges 38 projects gradually forwardly toward the hole 36.

The baffle plate 14 has a plurality of bosses 40 formed on the back side, for securing thereto by screws the duct lid 18, a plurality of holes 42 for passing screws therethrough to secure the baffle plate 14 to the box 12, a plurality of holes 44 for receiving the front grille 20, and a plurality of threaded holes 46 for passing screws therethrough for mounting the loudspeaker 26. The bosses 40 are provided along the bulges 38 and have threaded bores. The holes 44 are provided at four corners. The threaded holes 46 are provided along the hole 34.

Figure 10:
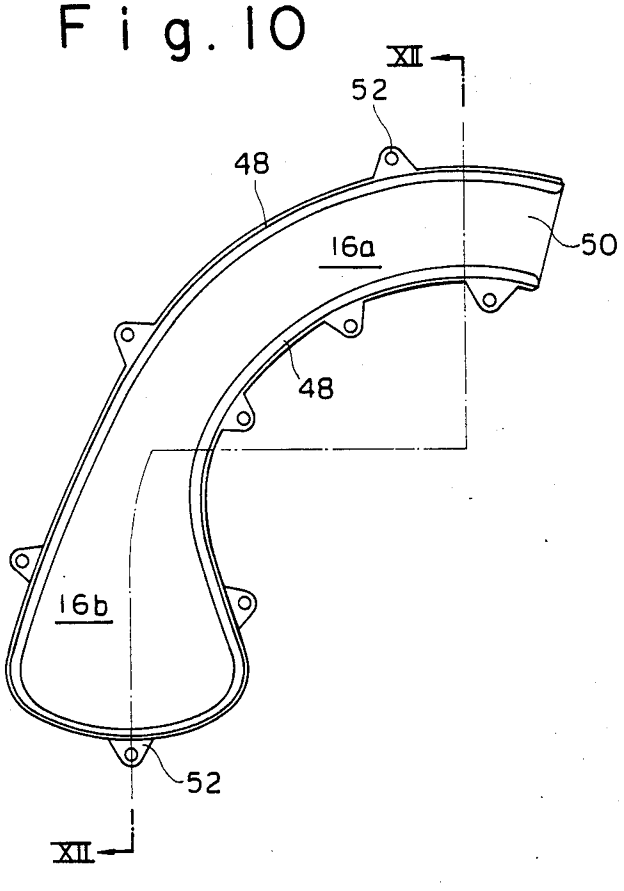
FIG. 10 is a front view showing a duct lid.
Figure 11:
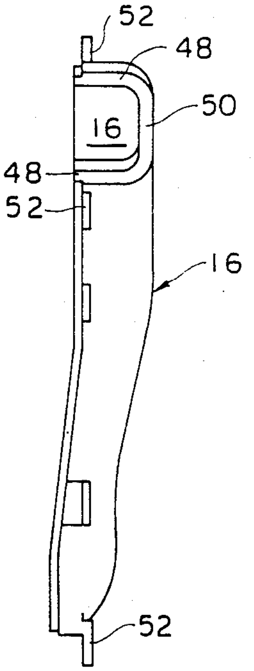
FIG. 11 is a right side view showing the duct lid.
Figure 12:
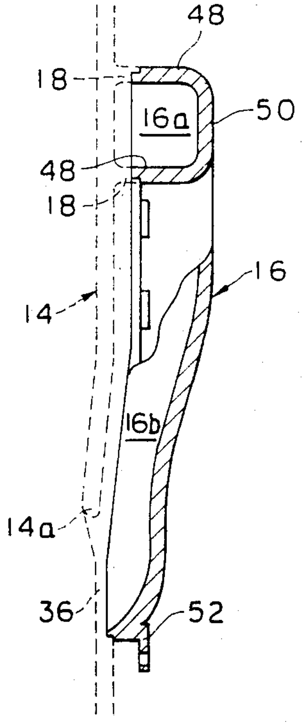
FIG. 12 is a sectional view taken along line XII—XII in FIG. 10.

As shown in FIGS. 10 to 12, the duct lid 18 has side portions 48 extending along the bulges 38 of the baffle plate 14 and around the hole 36 therein and a ceiling portion 50 connecting the side portions 38. the side portions 48 and the ceiling portion 50 are in a channel-shaped sectional profile.

As shown in FIG. 12, the side portions 48 are fitted in the bulges 38 of the baffle plate 14, and then a plurality of projections 52 projecting from the side portions 48 are secured by screws to the baffle plate 14. Thus, as shown in FIG. 12, the duct 16 open at the front and the back of the baffle plate 14 is formed by the baffle plate 14 and the duct lid 18.

The duct 16, as shown in FIG. 12, has a first duct section 16*a* corresponding to the first sections 38*a* of the bulges 38 and a second duct section 16*b* corresponding to the second sections 38*b*. The first duct section 16*a* is open at the back side of the baffle plate 14, and it has a substantially fixed cross-sectional area. On the other hand, the second duct section 16*b* is open at the front of the baffle plate 14 by the hole 36, and its cross-sectional area increases progressively from the first duct section 16*a* toward the hole 36. Section 16*b* is shorter in length than that of section 10*a* and comprises means for preventing audibly distorting vortex flow at the outside of the cabinet at hole 36. This audibly distorting vortex flow would occur if a duct of constant cross-sectional area corresponding to that of hole 36 and of duct length corresponding to the length of duct 16 interconnected hole 36 to the inside of the cabinet.

Figure 13:
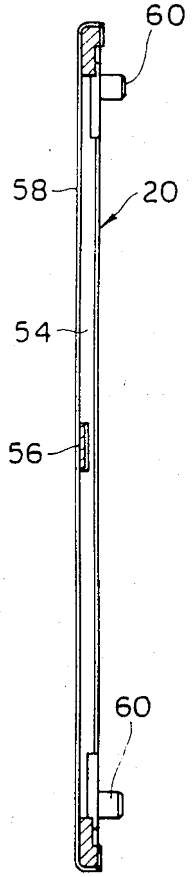
FIG. 13 is a sectional view showing a front grille.

The front grille 20, as shown in FIG. 13, has a frame 54, intermediate bar 56, cloth net 58 mounted in the frame 54, and bosses 60 received in the holes 44 in the baffle plate 14.

In the assembly of the cabinet 10, after the duct lid 18 and the loudspeaker 26 have been mounted on the baffle plate 14, this assembly is mounted on the box 12 by fitting the ridge 32 in the groove 22 and passing screws through the holes 42 in the baffle plate 14 and screwing them in the threaded bores in the supports 32 of the box 12. The front grille 20 is mounted on the baffle plate 14 by fitting the bosses 60 in the holes 46 of the baffle plate 14.

When the cabinet 10 is assembled as shown in FIG. 1, the first duct section 16*a* of the duct 16 is open into the cabinet 10 while the second duct section 16*b* is open to the outside of the cabinet 10. The duct 16 thus communicates the inside and outside of the cabinet 10.

When the loudspeaker 26 is operated, air in the cabinet 10 is moved from the inside to the outside of the cabinet 10 or in the opposite direction through the duct 16. At this time, the first duct section 16*a* functions as a resonating section.

On the other hand, since the cross-sectional area of the second duct section 16*b* increases gradually from the first duct section 16*a* toward the hole 36, the second duct section 16*b* functions to gradually reduce the pressure of air moving from the inside to the outside of the cabinet 10. In other words, even though air is moved through the duct 16, the pressure of air moving from the inside to the outside of the cabinet 10, i.e., wind pressure, is gradually reduced in the second duct section 16*b*, thus producing no vortex flow of the air. It is thus possible to cause no sound containing a distortion.

What is claimed is:

1. A cabinet having an outside duct opening which would be characterized by audibly distorting vortex flow therethrough if a port tube of duct length and cross-sectional area equal to that of said outside opening interconnected the inside of said cabinet and said outside duct opening for a loudspeaker comprising:
   - duct means for communicating with the inside and outside of said cabinet,
   - said duct means having a length equal to said duct length including a first duct section open to the inside of said cabinet and having a substantially constant cross-sectional area,
   - and a second duct section interconnecting said first duct section and said outside duct opening,
   - the cross-sectional area of said second duct section being gradually increased from that of said first duct section toward a larger cross-sectional area of said outside duct opening,
   - the length of said first duct section being greater than that of said second duct section and said second duct section being means for preventing audibly distorting vortex flow through said outside duct opening.

2. The cabinet for a loudspeaker according to claim 1, wherein said cabinet comprises a box with a front opening and a baffle plate closing said front opening of said box, the loudspeaker being mounted on said baffle plate, said duct means being provided on said baffle plate.

3. The cabinet for a loudspeaker according to claim 1, wherein said cabinet comprises a box with a front opening, a baffle plate closing said front opening of said box, the loudspeaker being mounted on said baffle plate, and a front grille provided on the front side of said baffle plate, said duct means being provided on said baffle plate.

4. The cabinet for a loudspeaker according to claim 2, wherein said box has a quadrangular pyramidal shape.

* * * * *